United States Patent
Ihara et al.

(10) Patent No.: US 7,220,657 B2
(45) Date of Patent: May 22, 2007

(54) SEMICONDUCTOR WAFER AND SEMICONDUCTOR DEVICE PROVIDED WITH COLUMNAR ELECTRODES AND METHODS OF PRODUCING THE WAFER AND DEVICE

(75) Inventors: Yoshihiro Ihara, Nagano (JP); Tsuyoshi Kobayashi, Nagano (JP); Shinichi Wakabayashi, Nagano (JP)

(73) Assignee: Shinko Electric Industries, Co., Ltd., Nagano (JP)

(*) Notice: Subject to any disclaimer, the term of this patent is extended or adjusted under 35 U.S.C. 154(b) by 518 days.

(21) Appl. No.: 10/323,645

(22) Filed: Dec. 20, 2002

(65) Prior Publication Data

US 2003/0096495 A1   May 22, 2003

Related U.S. Application Data

(62) Division of application No. 09/492,094, filed on Jan. 27, 2000, now abandoned.

(30) Foreign Application Priority Data

Jan. 27, 1999 (JP) .................................. 11-18229
Jan. 27, 1999 (JP) .................................. 11-18237

(51) Int. Cl.
*H01L 21/283* (2006.01)
(52) U.S. Cl. ........................ 438/466; 438/614; 438/652; 438/674; 257/E23.012
(58) Field of Classification Search ................ 438/466, 438/614, 652, 653, 654, 674, FOR. 330, 438/FOR. 343, FOR. 349, FOR. 350; 257/E23.012
See application file for complete search history.

(56) References Cited

U.S. PATENT DOCUMENTS

| 5,563,102 A | 10/1996 | Michael |
| 5,698,465 A | 12/1997 | Lynch et al. |
| 6,030,890 A * | 2/2000 | Iwabuchi ..................... 438/613 |
| 6,057,222 A | 5/2000 | Pahl et al. |
| 6,228,678 B1 | 5/2001 | Gilleo et al. |
| 6,297,140 B1 | 10/2001 | Uzoh et al. |
| 6,365,501 B2 * | 4/2002 | Farnworth ................... 438/614 |

FOREIGN PATENT DOCUMENTS

| DE | 197 41 436 A1 | 12/1998 |
| EP | 0 853 337 A1 | 7/1998 |
| EP | 1 011 141 A2 | 6/2000 |

OTHER PUBLICATIONS

Hou M.M.: "Super CSP: The Wafer Level Package" Jul. 1998, pp. F-01-F10.

* cited by examiner

*Primary Examiner*—George Fourson
(74) *Attorney, Agent, or Firm*—Morgan Lewis & Bockius LLP

(57) ABSTRACT

A semiconductor wafer provided with columnar electrodes which have plated nickel, palladium, and gold films successively formed at the top thereof, or have a plated solder film at their top. The semiconductor wafer can be preferably used for producing a chip-sized semiconductor device provided with columnar electrodes to which an external connection terminal, such as a solder ball, is to be bonded. Methods of producing the semiconductor wafer and device by use of plating are also disclosed.

16 Claims, 11 Drawing Sheets

SEMICONDUCTOR WAFER AND SEMICONDUCTOR DEVICE PROVIDED WITH COLUMNAR ELECTRODES AND METHODS OF PRODUCING THE WAFER AND DEVICE

This application is a divisional of U.S. Ser. No. 09/492,094, filed Jan. 27, 2000 now abandoned, which claims priority from Japanese Nos. 11-18229 and 11-18237, both filed in Japan on Jan. 27, 1999.

BACKGROUND OF THE INVENTION

1. Field of the Invention

The invention relates to a semiconductor wafer provided with columnar electrodes used for manufacturing semiconductor devices having a size which is approximately the same as a size of a chip sliced from the wafer, which are also called chip-sized packages, and a method of the production such a semiconductor wafer. The invention also related to a semiconductor device provided with columnar electrodes and a method of manufacturing the device.

2. Description of the Related Art

FIGS. 11A to 11G illustrate a method of producing a semiconductor wafer, provided with columnar electrodes, used for manufacturing chip-sized packages. FIG. 11A shows a partially enlarged section of a semiconductor wafer 10, on which electrode terminals 12 (the drawing shows only one of them) and a passivation film 14 are formed. A material, such as polyimide, is coated on the electrode terminals 12 and the passivation film 14, and the coated film is then patterned to form an insulation layer 16 exposing the electrode terminals 12 (FIG. 11B). A conductor layer 18 is then formed to cover the exposed electrode terminals 12 and the insulation layer 16, by sputtering (FIG. 11C), which subsequently serves as an electric power supply layer for plating. A resist material is applied onto the conductor layer 18 to form a resist film, which is then patterned to form a resist pattern 20 for the formation of a wiring line pattern (FIG. 11D). Using the resist pattern 20 as a mask, the conductor layer 18 is then electrolytically plated with copper to form a patterned copper layer 22 (FIG. 11E). The patterned copper layer 22 is connected, at an end, with the electrode terminal 12 through the underlying conductive layer 18, and has a pad portion 23 at the other end, on which a columnar electrode is to be formed.

Subsequently, the resist pattern 20 is removed, and a further resist pattern 26 is formed which has openings 26a for the formation of a columnar electrode on the pad portion 23 (FIG. 11F). The film of resist pattern 26 has a thickness which is slightly larger than a height of a columnar electrode which is to be subsequently formed. A columnar electrode 24 is then formed in the opening 26a by electrolytically plating the exposed pad portion 23 with copper, the formed columnar electrode 24 having a height of the order of 100 micrometers. The columnar electrode 24 has plated films, such as plated nickel and palladium films, on its top face, which are not shown in FIG. 11F. The resist pattern 26 is then removed, and the exposed conductive layer 18 is etched and removed so as to provide a patterned wiring line 27, which consists of the copper layer 22 and the underlying conductor layer 18 (FIG. 11G).

In this way, a semiconductor wafer 10 is obtained which has, on its surface, a number of patterned wiring lines 27 which are connected with the electrode terminal 12 at one end, and has the columnar electrode 24 at the other end.

FIGS. 12A and 12B illustrate a method of encapsulating a semiconductor wafer 10, having formed columnar electrodes 24, by a resin. The semiconductor wafer 10 is placed on a lower mold 31, with the face having the columnar electrodes 24 being faced upwardly. A resin material for encapsulation 28 is supplied onto the wafer 10, and the wafer 10 is then clamped together with the resin material 28 between an upper mold 32 having an encapsulating film 30 attached to its clamping face and the lower mold 31, as shown in FIG. 12A. By this clamping, molten resin is spread over the electro-deformed face of the semiconductor wafer 10 to encapsulate it, as shown in FIG. 12B. After the encapsulation, the wafer 10 having the encapsulating film 30 attached thereto is removed from the molds 31, 32, and the film 30 is peeled from the wafer 10. Terminals for mounting (not shown), such as solder balls, are subsequently bonded to the top faces of columnar electrodes 24, and the semiconductor wafer 10 is then cut into individual chips to provide chip sized packages.

In the above method, the top faces of the columnar electrodes 24 are covered during the encapsulation of the semiconductor wafer 10 by the film 30 in order to prevent the encapsulating resin 28 from adhering to the top faces of the columnar electrodes 24. However, because of the uneven heights of the columnar electrodes 24, for example, the encapsulating resin may intrude into the space between the top face of the columnar electrode 24 and the encapsulating film 30 during the encapsulation, and be left on the top face of the columnar electrode 24 and adhered thereto.

The encapsulating film 30 is peeled from the encapsulated semiconductor wafer 10 after the encapsulation in order to remove the resin left on the top face of the columnar electrode by adhering the resin to the film 30. However, merely by peeling the encapsulating film 30 from the encapsulated semiconductor wafer 10, the resin left on the top face of the columnar electrode 24 is not always fully removed. The top face of the columnar electrode 24 is a bonding face for a mounting terminal, such as a solder ball, to be bonded thereto, and the resin adhered to the top face of the columnar electrode 24 raises a problem in terms of bonding of the columnar electrode 24 to the terminal. For this reason, the top face of the columnar electrode 24 is cleaned after peeling off the encapsulating film 30 by, for example, blasting.

However, the resin left on the top face of the columnar electrode 24 cannot always be fully removed even by such cleaning, and excessive cleaning to completely remove the resin from the top face of the columnar electrode 24 raises problems such as adverse deterioration of the encapsulating resin.

As such, in the conventional method of producing a semiconductor wafer provided with columnar electrodes, there has been a problem that an encapsulating resin is left on the top faces of the columnar electrodes to thereby prevent bonding of the columnar electrodes to mounting terminals.

SUMMARY OF THE INVENTION

The invention is intended to solve such prior problems, and an object of the invention is to provide a semiconductor wafer provided with columnar electrodes which can be satisfactorily bonded to mounting terminals, and can provide chip sized packages having higher reliability, and a method suitable for the production of such a semiconductor wafer.

Another object of the invention is to provide a semiconductor device produced using such a semiconductor wafer provided with columnar electrodes and a method suitable for the production of such a device.

Thus, in one aspect, a semiconductor wafer provided with columnar electrodes according to the invention has electrode terminals formed in its surface, an insulation film formed so as to expose the top of the electrode terminals, patterned wiring lines formed on the insulation film, each of the patterned wiring lines being connected, at one end, with the electrode terminal, and provided with a columnar electrode formed on the other end, and an encapsulating layer formed so as to cover the electrode-formed face of the wafer while exposing the top faces of the columnar electrodes, wherein the columnar electrodes are provided with plated nickel or nickel alloy, palladium, and gold films successively formed at their top.

Preferably, the plated palladium film has a thickness of 0.2 micrometer or less, and the plated gold film has a thickness of 0.001 to 0.1 micrometer.

More preferably, the plated palladium film has a thickness of 0.05 to 0.1 micrometer, and the plated gold film has a thickness of 0.01 to 0.05 micrometer.

In another aspect, the semiconductor wafer provided with columnar electrodes as set forth above is produced by a method of producing a semiconductor wafer of the invention, which comprises forming an insulation layer on the surface of a semiconductor wafer on which electrode terminals have been formed, so as to expose the top of the electrode terminals, forming a conductor layer on the electrode terminals and the insulation layer, forming a resist pattern on the conductor layer, plating the conductor layer with copper using the resist pattern as a mask and using the conductor layer as an electric power supply layer to thereby form a patterned copper layer having an end connected with the electrode terminal through the underlying conductor layer, removing the resist pattern, forming a further resist pattern on the patterned copper layer and the conductor layer, the further resist pattern having openings for formation of columnar electrodes on the other ends of the patterned copper layer, forming columnar electrodes of copper on the other ends of the copper layer in the openings by plating using the conductor layer as an electric power supply layer, forming a plated nickel film or plated nickel alloy film on the top face of the columnar electrodes, forming a plated palladium film and a plated gold film successively on the nickel or nickel alloy film, removing the further resist pattern, removing the exposed conductor layer, and encapsulating the electrode terminal-formed face of the wafer so as to expose the gold film at the top of the columnar electrode.

In a further aspect, a semiconductor wafer provided with columnar electrodes according to the invention has electrode terminals formed in its surface, an insulation film formed so as to expose the top of the electrode terminals, patterned wiring lines formed on the insulation film, each of the patterned wiring lines being connected, at one end, with the electrode terminal, and provided with a columnar electrode formed on the other end, and an encapsulating layer formed so as to cover the electrode-formed face of the wafer while exposing the top face of the columnar electrodes, wherein the columnar electrodes are provided on their top with a plated solder film.

Preferably, the plated solder film projects over the outer surface of the encapsulating layer, and the interface between the plated solder film and the top of an underlying film, on which the plated solder film is formed, of the columnar electrode is located below the outer surface of the encapsulating layer.

Preferably, a plated nickel film or plated nickel alloy film is formed as a layer underlying the plated solder film.

Also preferably, a plated palladium film is formed as a layer underlying the plated solder film, and a plated nickel film or plated nickel alloy film is formed as a layer underlying the plated palladium film.

Also preferably, a plated gold film is formed as a layer underlying the plated solder film, and a plated nickel film or plated nickel alloy film is formed as a layer underlying the plated gold film.

Also preferably, a plated gold film is formed as a layer underlying the plated solder film, a plated palladium film is formed as a layer underlying the gold film, and a plated nickel film or plated nickel alloy film is formed as a layer underlying the palladium film.

In a further aspect, the semiconductor wafer provided with columnar electrodes as set forth above is produced by a method of producing a semiconductor wafer of the invention, which comprises forming an insulation layer on the surface of a semiconductor wafer on which electrode terminals have been formed, so as to expose the top of the electrode terminals, forming a conductor layer on the electrode terminals and the insulation layer, forming a resist pattern on the conductor layer, plating the conductor layer with copper using the resist pattern as a mask and using the conductor layer as an electric power supply layer to thereby form a patterned copper layer having an end connected with the electrode terminal through the underlying conductor layer, removing the resist pattern, forming a further resist pattern on the patterned copper layer and the conductor layer, the further resist pattern having openings for formation of columnar electrodes on the other ends of the patterned copper layer, forming a portion of copper of an columnar electrode on the other end of the copper layer in the openings by plating using the conductor layer as an electric power supply layer, forming a plated film on the top face of the copper portion of the columnar electrodes, forming a plated solder film on the top of the plated film, removing the further resist pattern, removing the exposed conductor layer, and encapsulating the electrode terminal-formed face of the wafer so as to expose the top of the plated solder film.

In a still further aspect, the invention provides a semiconductor device which has electrode terminals formed in a surface of a semiconductor substrate, such as a substrate separated from a semiconductor wafer on which a number of semiconductor devices are manufactured together, an insulation film formed so as to expose the top of the electrode terminals, patterned wiring lines formed on the insulation film, each of the patterned wiring lines being connected, at one end, with the electrode terminal, and provided with a columnar electrode formed on the other end, external connection terminals bonded to the top of the columnar electrodes, and an encapsulating layer formed so as to cover the electrode-formed face of the semiconductor device while exposing the external connection terminals, wherein the interface between the top of the columnar electrode and the external connection terminal is located below the outer surface of the encapsulating layer.

The semiconductor device of the invention can be produced by a method comprising forming an insulation layer on the surface of a semiconductor wafer on which electrode terminals have been formed, so as to expose the tops of the electrode terminals, forming a conductor layer on the electrode terminals and the insulation layer, forming a resist pattern on the conductor layer, plating the conductor layer with copper using the resist pattern as a mask and using the conductor layer as an electric power supply layer to thereby form a patterned copper layer having an end connected with the electrode terminal through the underlying conductor layer, removing the resist pattern, forming a further resist pattern on the patterned copper layer and the conductor layer, the further resist pattern having openings for formation of columnar electrodes on the other ends of the patterned copper layer, forming a portion of copper of an columnar electrode on the other end of the copper layer in the openings by plating using the conductor layer as an electric power supply layer, forming a plated film on the top faces of the copper portion of the columnar electrodes, forming a plated solder film on the top of the plated film, removing the further resist pattern, removing the exposed conductor layer, encapsulating the electrode terminal-formed face of the wafer so as to expose the top of the plated solder film, to thereby provide a semiconductor wafer provided with columnar electrodes, bonding an external connection terminal to the top of the plated solder film of each of the columnar electrodes, and cutting the wafer into individual chips.

BRIEF DESCRIPTION OF THE DRAWINGS

The above and other objects and advantages of the invention will be well understood and appreciated by a person with ordinary skill in the art, from consideration of the following detailed description made by referring to the attached drawings, wherein.

DETAILED DESCRIPTION OF THE INVENTION

Figure 1:
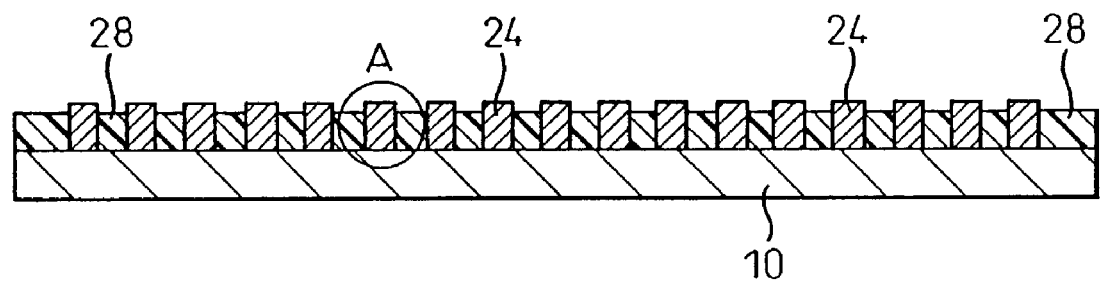
FIG. 1 schematically illustrates an embodiment of the semiconductor wafer of the invention.
Figure 2:
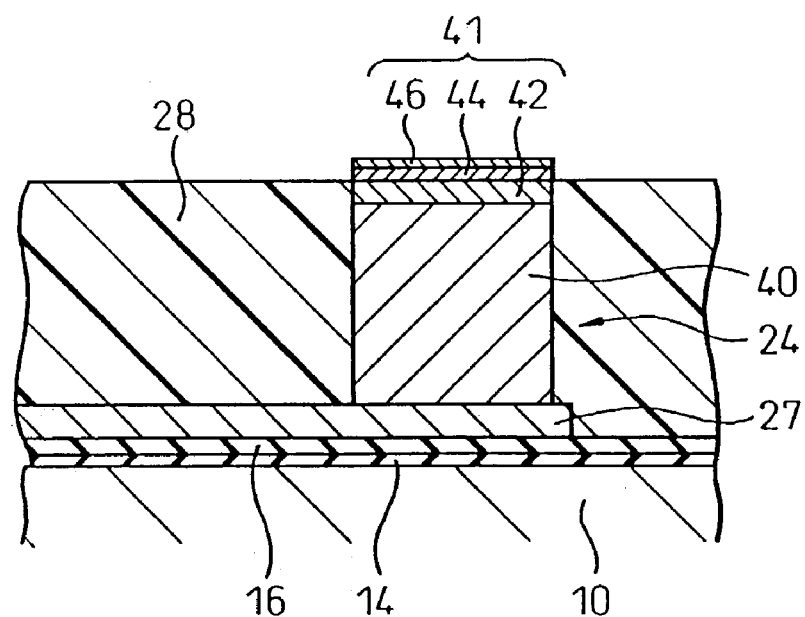
FIG. 2 is an enlarged view of part, indicated by A, of the semiconductor wafer of FIG. 1.

Referring to FIGS. 1 and 2, an embodiment of the semiconductor wafer of the invention, which is characterized by its columnar electrodes, is described. This semiconductor wafer has the same constitution as that of the prior semiconductor wafer formerly described except for the plated films successively formed at the top of the columnar electrodes. Accordingly, the following description mainly covers the structure associated with the plated films at the top of the columnar electrode, and members which are the same as those of the prior semiconductor wafer formerly illustrated referring to FIG. 11 are identified by the same reference numbers.

As illustrated in FIG. 1, which schematically shows the entire semiconductor wafer 10 provided with columnar electrodes 24 according to the invention, and FIG. 2, which is a partially enlarged view of the portion indicated by A in FIG. 1, the semiconductor wafer 10 of the invention comprises a passivation film 14 formed on the surface of the wafer so as to expose electrode terminals (not shown) having been formed thereon, an insulation film 16 formed so as to expose the tops of the electrode terminals, patterned wiring lines 27 formed on the insulation film 16, each of the patterned wiring lines 27 being connected, at one end, with the electrode terminal, and provided with a columnar electrode 24 formed on the other end, and an encapsulating layer 28 formed so as to cover the electrode-formed face of the wafer 10 while exposing the top faces of the columnar electrodes 24. As shown, all spaces between adjacent columnar electrodes 24 are filled with the resin of the encapsulating layer 28, which encapsulates the electro-deformed face of the wafer 10.

The characteristic feature of the semiconductor wafer 10 of this embodiment consists in the columnar electrode 24 which has a portion of copper 40 as a main conductor portion and a plated film portion 41 located on the copper portion 40 and consisting of a plated nickel film (or Ni alloy film) 42 on the top of the copper portion 24, a plated palladium film 44 on the nickel film 42, and a plated gold film 46 on the palladium film 44.

Providing a plated film or films on the top of the copper portion 40 of a columnar electrode is conventional. For example, a columnar electrode provided with two films of nickel and gold, or two films of nickel and palladium, is known. Unlike such a conventional columnar electrode provided with two metallic films, the columnar electrode in the invention is provided with three metallic films of nickel, palladium, and gold. In the invention, by the columnar electrodes 24 having the copper portion 40 and the plated film portion 41 consisting of the nickel film 42, the palladium film 44, and the gold film 46 formed successively on the copper portion 40, the wafer 10 can obtain columnar electrodes which can be satisfactorily bonded to an external connection terminal, such as a solder ball, for mounting the wafer to a substrate.

Conventional columnar electrodes are provided on their top with two metallic films of nickel and palladium or gold, as referred to above, the metals serving as so-called barrier metals. The nickel film is for preventing diffusion of a solder (a material of external connection terminal), and the palladium or gold film is for improving wettability of the columnar electrode by the solder to provide strong bonding of the solder to the columnar electrode. In a columnar electrode provided with two films of this type, the palladium or gold film must have a thickness of 0.1 micrometer or larger (for example, 0.1 to 0.15 micrometer for a gold film, and 0.2 micrometer or more for a palladium film) in order to provide satisfactory bonding of the solder to the electrode. However, palladium as well as gold are costly. Additionally, palladium has a poor effect on improvement of solder-wettability, and gold can cause, particularly at a larger thickness, weaker bonding of a solder to the columnar electrode due to formation of Au—Sn alloy during solder-reflowing.

In contrast, when the plated film portion 41 has a three-layer structure of the plated nickel film (or Ni alloy film) 42, the plated palladium film 44, and the plated gold film 46, as in the embodiment of the invention described above, the palladium film 44 may have a thickness of 0.2 micrometer or less, preferably 0.05 to 0.1 micrometer, which is approximately half of the thickness of the palladium layer in the case of the plated film portion of two-layer structure. In the three-layer structure of the invention, the gold film 46 can also have a very small thickness of 0.001 to 0.1 micrometer, preferably 0.01 to 0.05 micrometer. The reason that the palladium film 44 of the three-layer structure can have such a very smaller thickness is that the wettability of the columnar electrode 24 by a solder can be effectively improved by the gold film 46 located on the palladium film 44 compared with the two-layer structure in which only palladium film is used on the nickel film. It should also be noted that the total of thicknesses of palladium and gold can be smaller than 0.1 micrometer.

When a solder ball is bonded, as an external connection terminal, to a columnar electrode, materials of the plated gold film 46 and the plated palladium film 44 are both diffused into molten solder to thereby strongly bond the solder ball to the plated nickel film (or plated Ni alloy film, such as an Ni—Co alloy) 42. Thus, the plated gold film 46 and the plated palladium film 44 contribute to wettability of the nickel film 42 by solder, and, when the plated gold film 46 is provided on the outer surface of the plated film portion 41, as in the embodiment as described above, sufficient solder-wettability can be obtained even at a smaller thickness of the palladium film 44 compared to the case where only palladium film 44 is provided on the nickel film 22. In addition, a gold film having a thickness as small as that of a flash plated film can provide good solderability.

By improving solder-wettability using the plated palladium film 44 and the plated gold film 46, it becomes possible to securely bond an external connection terminal, such as a solder ball, to the columnar electrode 24 even if the resin 28 is more or less adhered to the surface of the plated film provided at the top of the columnar electrode 24 during the encapsulation of the semiconductor wafer 10. Consequently, it becomes unnecessary to excessively clean the plated film portion 41 formed at the top of the columnar electrode 24 to completely remove a resin left the surface of the plated film portion 41 after the encapsulation of the semiconductor wafer 10.

Adhesion of the resin 28 to the surface of the plated gold film 46 is low and, accordingly, providing the surface of the plated film portion 41 with the plated gold film 46 makes it easy to peel off the resin left between the surface of the plated gold film 46 and an encapsulating film by adhering the resin to the encapsulating film rather to the gold film 46 when removing the encapsulating film after the encapsulation of the electrode terminal-formed side of the semiconductor wafer 10 by, and enables the resin 28 to be prevented from remaining on the surface of the plated gold film 46.

FIGS. 3A to 3D illustrate an embodiment of the method of producing a semiconductor wafer provided with columnar electrodes of the invention. This method is similar to conventional methods of producing a semiconductor wafer provided with columnar electrodes except for the formation of the plated film portion 41 of the columnar electrode 24. Accordingly, FIGS. 3A to 3D mainly illustrates steps of the formation of the plated film portion 41.

Figure 3A:
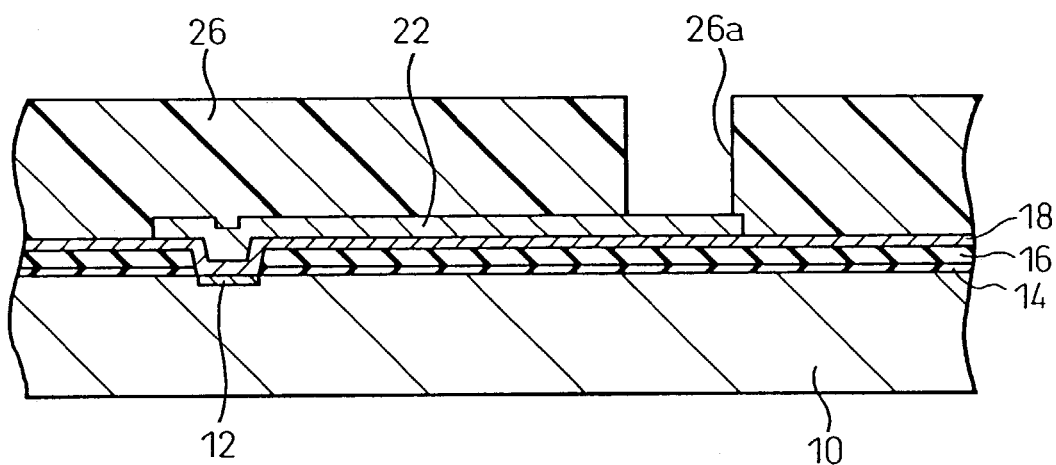
FIGS. 3A to 3D show a method of producing the semiconductor wafer illustrated in FIGS. 1 and 2.

FIG. 3A shows a condition in which a patterned copper layer 22 is formed on a conductive layer 18 of the electrode terminal-formed face of a semiconductor wafer 10, the copper layer 22 being electrically connected, at one end, with an electrode terminal 12 of the wafer 10 through the conductor layer 18, and a resist pattern 26 is then formed, the resist pattern 26 having an opening or hole 26a at the location at which a columnar electrode is to be formed at the other end of the copper layer 22.

Figure 3B:
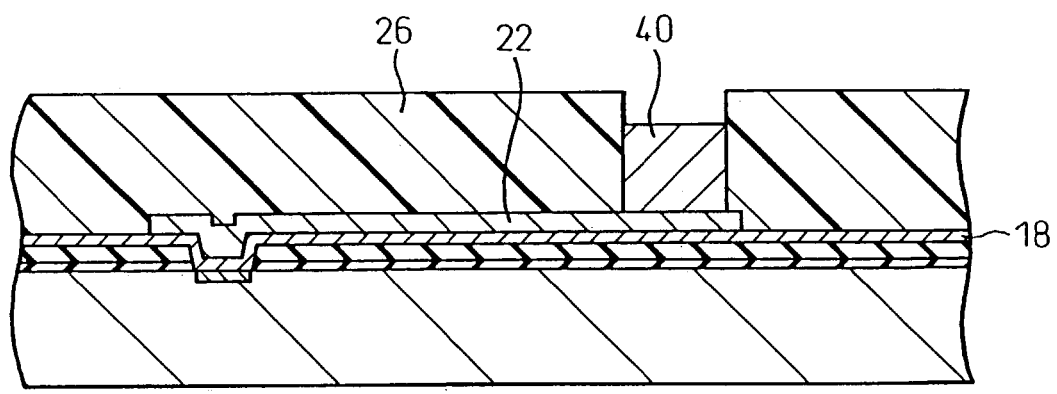

After the formation of the resist pattern 26 having the openings 26a, the exposed other end of the copper layer 22 is electrolytically plated with copper to form a plated copper portion 40 using the conductor layer 18 as an electric power supply layer, as shown in FIG. 3B. The plated copper portion 40 represents a chief conducting portion of a columnar electrode, and is formed by depositing or building up the plated copper on the exposed portion of the copper layer 22 up to a height at which the plated copper approximately fills the opening 26a. In general, a columnar electrode has a height of about 100 micrometers, and the resist pattern 26 is accordingly formed to have a thickness of about 100 micrometers.

Figure 3C:
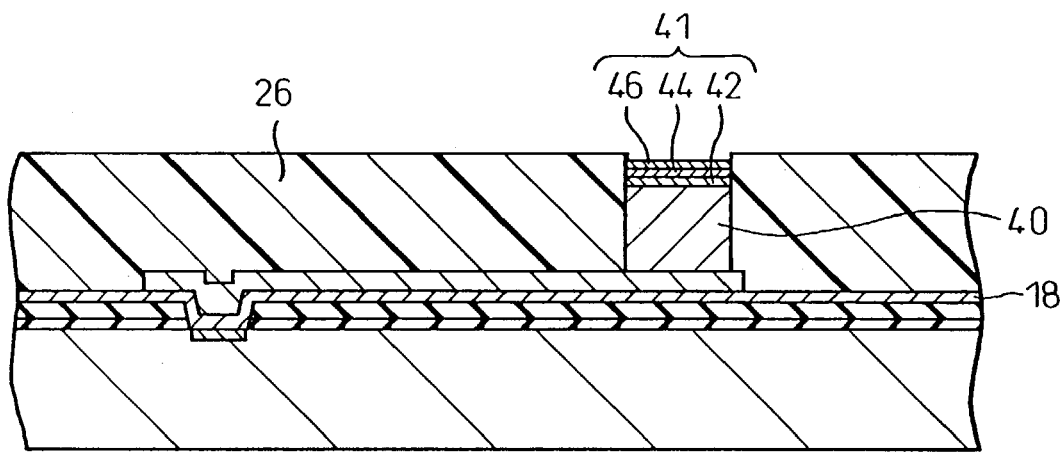

A plated film portion 41 is then formed by plating the top of the plated copper portion successively with nickel, palladium, and gold, as shown in FIG. 3C. Thus, the plated film portion 41 has a three-layer structure of the plated nickel film or plated Ni—Co alloy film 42, the plated palladium film 44, and the plated gold film 46. For example, the nickel, palladium, and gold films 42, 44, and 46 have a thickness of about 3 micrometers, 0.05 micrometer, and 0.01 micrometer, respectively.

Figure 3D:
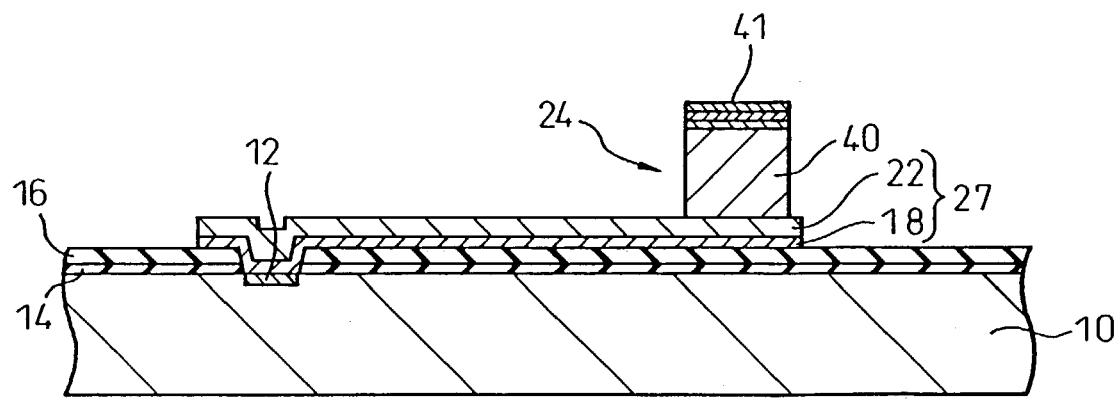

After the formation of the plated film portion 41, the resist pattern 26 is removed, and the exposed conductor layer 18 is then etched to form patterned wiring lines 27 with the overlaying copper layer 22, and to provide a semiconductor wafer 10 provided with columnar electrodes 24 having the plated film portion 41 of three-layer structure consisting of the plated nickel, palladium, and gold films 42, 44, and 46 formed at their top, as shown in FIG. 3D. The conductor layer 18 has a thickness of the order of 0.05 micrometer, which is much thinner than thicknesses of the columnar electrode 24 and the patterned copper layer 22, and, consequently, only conductor layer 18 can be removed by etching without covering the columnar electrodes 24 and the copper layer 22 with a material such as a resist for protection.

For the formation of the plated film portion 41 in the invention, a conventional process for plating the exposed end portion of the copper layer 22 with copper may be applied, and it is easy to form a laminate of a three-layer structure of the plated nickel, palladium, and gold films 42, 44, and 46.

Figure 12A:
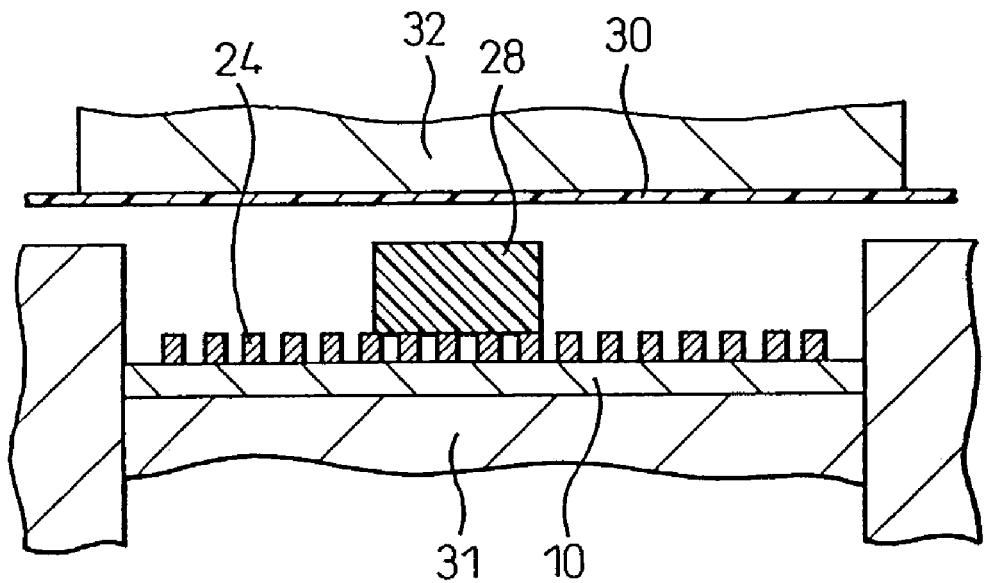
FIGS. 12A and 12B schematically show encapsulation of a semiconductor wafer provided with columnar electrodes.
Figure 12B:
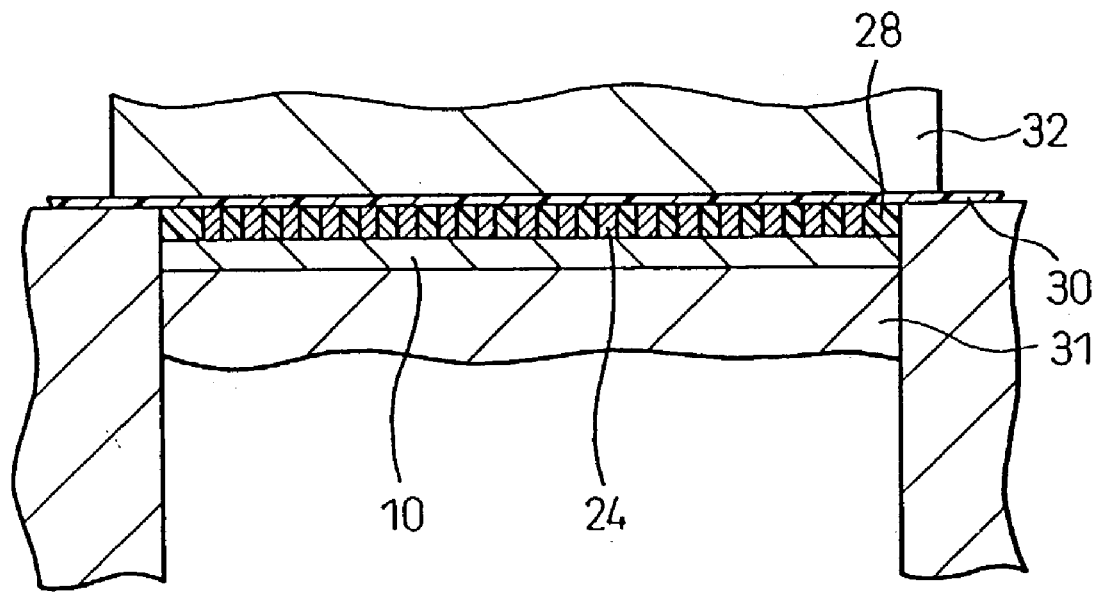

After the columnar electrodes 24 are thus formed, a product semiconductor wafer is obtained by encapsulating the side of semiconductor wafer 10, having formed thereon the columnar electrodes 24, by an encapsulating resin in such a manner that the surface of the plated gold film at the top end of the columnar electrode 24 is exposed, as earlier described with reference to FIG. 12.

An external connection terminal for mounting, such as a solder ball, is then bonded to each of the columnar electrodes 24 of the encapsulated semiconductor wafer 10, and the semiconductor wafer 10 is cut into individual chips, to provide a chip-sized semiconductor device having columnar electrodes.

Figure 4:
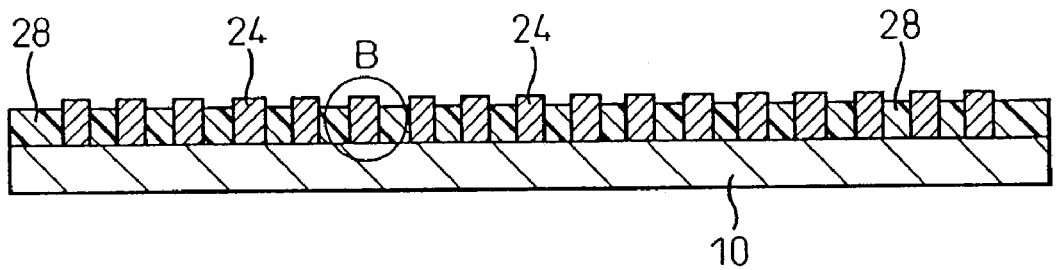
FIG. 4 schematically illustrates another embodiment of the semiconductor wafer of the invention.
Figure 5:
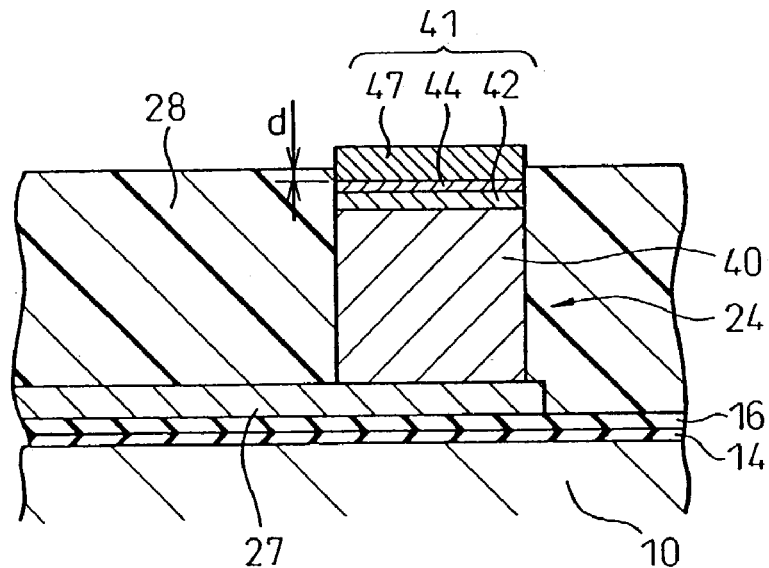
FIG. 5 is an enlarged view of part, indicated by B, of the semiconductor wafer of FIG. 4, illustrating an example of the columnar electrode in the invention.

Referring to FIGS. 4 and 5, another embodiment of the semiconductor wafer of the invention is described. This semiconductor wafer, which may also be used for the manufacture of a chip sized package, has the same constitution as that of the prior semiconductor wafer formerly described except for the structure of the columnar electrodes. Accordingly, the following description mainly covers the structure of the columnar electrode, and members which are the same as those of the prior semiconductor wafer formerly illustrated referring to FIG. 11 are identified by the same reference numbers.

As earlier illustrated, a semiconductor wafer 10 comprises a passivation film 14 formed on the surface of the wafer so as to expose electrode terminals (not shown) having been formed thereon, an insulation film 16 formed so as to expose the tops of the electrode terminals, patterned wiring lines 27 formed on the insulation film 16, each of the patterned wiring lines 27 being connected, at one end, with the electrode terminal, and provided with a columnar electrode 24 formed on the other end, and an encapsulating layer 28 formed so as to cover the electrode-formed face of the wafer 10 while exposing the top faces of the columnar electrodes 24. As shown, all spaces between adjacent columnar electrodes 24 are filled with the resin of the encapsulating layer 28, which encapsulates the electrode-formed-face of the wafer 10.

FIG. 5 shows an enlarged partial section of the wafer 10 in FIG. 4. The semiconductor wafer 10 of this embodiment is characterized in that a base portion (a chief conducting portion) of the columnar electrode 24 is made of plated copper, forming a plated copper portion 40, and, on the top of the columnar plated copper portion 40, a plated nickel film or plated Ni alloy film 42, a plated palladium film 44, and a plated solder film 47 are successively provided to form a plated film portion 41.

As described above, providing a plated film or films on the top of the copper portion 40 of a columnar electrode 24 is conventional. For example, a plated nickel film or plated Ni alloy film for preventing diffusion of solder is provided on the copper portion 40, and a plated palladium film for improving the wettability of the electrode 24 by a solder is provided on the nickel film, to thereby improve, as a whole, bonding between the columnar electrode 24 and the solder.

In this embodiment of the invention, the plated nickel, palladium, and solder films 42, 44, and 47 are successively provided on the top of the columnar electrode 24. A feature of structure of the plated film portion made up of these three films is that the plated solder film 47 is provided at the outermost layer to have a relatively large thickness, and the interface between the plated solder film 47 and the underlying palladium film 44 is positioned at a height which is lower than a height of the outer surface of the encapsulating resin layer 28. In FIG. 5, a difference between the height of the interface of the solder film 47 and the palladium film 44 and the height of the outer surface of the encapsulating resin layer 28 is indicated by d. This difference d may be determined mainly taking into account a height of the encapsulating resin layer 28, and may be about 10 micrometers for an encapsulation layer 28 of 100 micrometers thick.

As described above, the plated nickel film 42 aims at preventing diffusion of solder, the plated palladium film 44 aims at improving solder-wettability, and the plated solder film 47 aims at further improving wettability of the columnar electrode 24 by a solder-based mounting terminal, such as a solder ball, to strongly bond the terminal to the columnar electrode.

Figure 6:
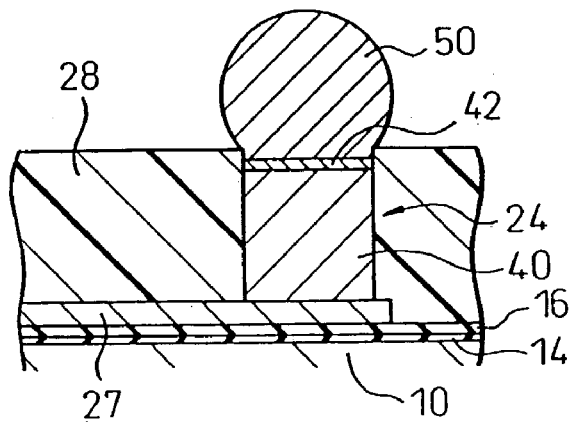
FIG. 6 shows a columnar electrode provided with an external connection terminal in the invention.

FIG. 6 shows a solder ball 50 bonded to a columnar electrode 24. By reflowing the solder ball 50, the solder material of the plated solder film 47 (FIG. 5) and the palladium material of the plated palladium film 44 (FIG. 5) are diffused into the melted solder of the solder ball 50, and the solder ball 50 is firmly bonded to the plated nickel film 42 of the columnar electrode 24. In this way, using a solder ball, a solder bump for an external connection terminal is formed.

As a result of the interface between the plated solder film 46 and the plated palladium film 44 being located below the outer surface of the resin layer 28 prior to the solder ball reflowing, the solder ball 50 is bonded to the columnar electrode 24, with the bottom of the solder ball 50 intruding into the inside of the resin layer 28 (below the outer surface of the resin layer 28). Thus, the site of bonding of the solder ball 50 to the columnar electrode 24 is supported in a depression having a side wall of resin layer 28 and a bottom of plated nickel film.24 and, consequently, the solder ball 50 can be firmly supported to have improved endurance to an outside force.

As described above referring to FIG. 12, a semiconductor wafer provided with columnar electrodes is clamped by the upper mold 32 and the lower mold 31 using the encapsulating film 30 for resin-encapsulation. During the encapsulation, the encapsulating film 30 is compressed, and the top ends of the columnar electrodes 24 more or less intrude into the encapsulating film 30. As a result, the encapsulated semiconductor wafer has the columnar electrodes 24 having the top ends more or less projecting over the outer surface of the resin layer 28. Using the columnar electrode 24 having such projected top end, a mounting terminal, such as a solder ball, is bonded to the projected top end of the columnar electrode 24 and, if the resin is left on the top end of the columnar electrodes 24, an area of contact of the bottom of the mounting terminal with the top end of the columnar electrode 24 is reduced, and the bonding of the terminal and the electrode can be weakened.

In contrast, when the plated solder film 47 is provided on the top of the columnar electrode 24, as in the invention, an encapsulating resin is never left on the film underlying the solder film 46 and, consequently, it is possible to firmly bond the solder ball 50 to the whole surface of the top of the underlying nickel film, as described above referring to FIG. 6. Furthermore, according to the invention, the solder ball 50 is bonded to the columnar electrode 24, with the bottom of the solder ball 50 intruding into the depression surrounded by the side wall of resin layer 28 and, consequently, the bonded solder ball (solder bump) 50 is firmly supported by the side wall. By these synergistic effects, the bonding strength of a mounting terminal to an columnar electrode can be highly increased.

The plated nickel, palladium, and solder films 42, 44, and 47 may have any appropriate thickness. For example, the plated nickel, palladium, and solder films 42, 44, and 47 have thicknesses of 3, 0.15, and 3 micrometers, respectively.

The height of the interface between the solder ball 50 and the columnar electrode 24 after the bonding of the solder ball 50 to the columnar electrode 24, is precisely the interface between the plated nickel film 42 and the plated palladium film 44 before the bonding because the palladium of the plated palladium film 44 is diffused into the melted solder during the bonding of the solder ball 50. For the formation of the plated solder film 47, since the plated palladium film 44 has a much smaller thickness than the thickness of the plated solder film 47, it is sufficient that the columnar electrode 24 is formed taking care of the height of the bottom of the plated solder film 47 or the height of the top of the plated nickel film 42.

It is possible to substitute a plated gold film for the plated palladium film 44 of the plated film portion 41 shown in FIG. 5. In the case of use of the plated gold film, it can have a thickness similar to the thickness of the plated palladium film 44. Like the plated palladium film, the plated gold film can improve the wettability of the nickel film 42 by a solder, and can provide satisfactory bonding of a mounting terminal, such a solder ball, to the columnar electrode 24.

Figure 7:
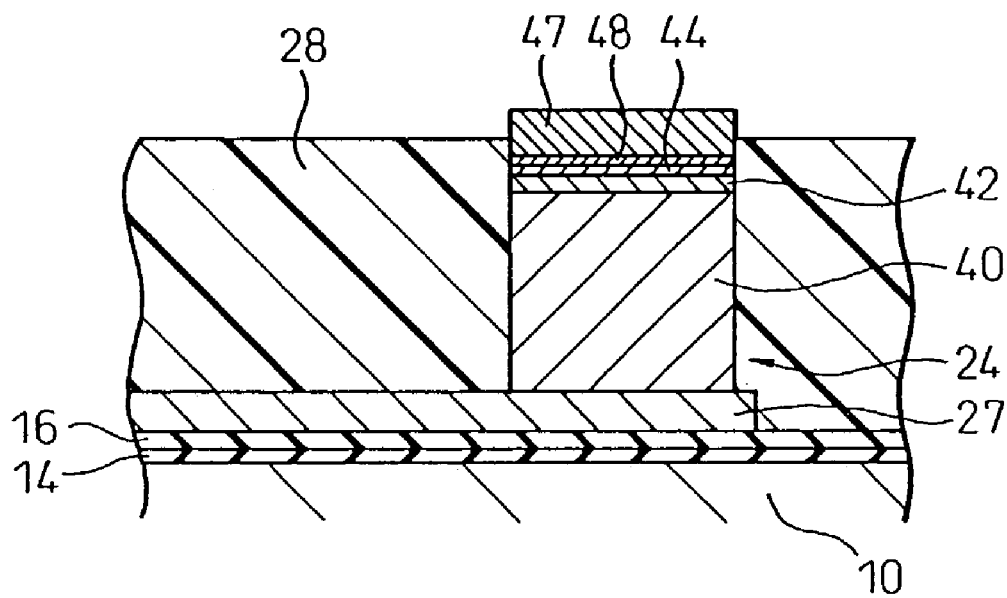
FIG. 7 shows another example of the columnar electrode in the invention.

FIG. 7 illustrates another columnar electrode 24 of the semiconductor wafer 10 according to the invention. In this embodiment, the columnar electrode 24 has a plated nickel film 42, a plated palladium film 44, a plated gold film 48, and a plated solder film 47 successively formed at the top of the columnar electrode 24. The height of the interface between the plated solder film 47 and the plated gold film 48 is lower than the height of the outer surface of the resin layer 28, as in the former embodiment.

When the plated gold film 48 is provided on the plated palladium film 44, as in this embodiment, the plated palladium film 44 can have a smaller thickness compared to the case where the plated gold film 48 is not provided. In this embodiment, the plated nickel, palladium, gold, and solder films 42, 44, 48, and 47 have thicknesses of 3, 0.05, 0.01, and 3 micrometers, respectively, by way of example. Thus, when the plated palladium and gold films 44 and 48 are provided, the respective-films can have a smaller thickness, and solder-wettability of the columnar electrode 24 can be improved, to thereby result in firm bonding of a solder ball to the columnar electrode 24.

Figure 8:
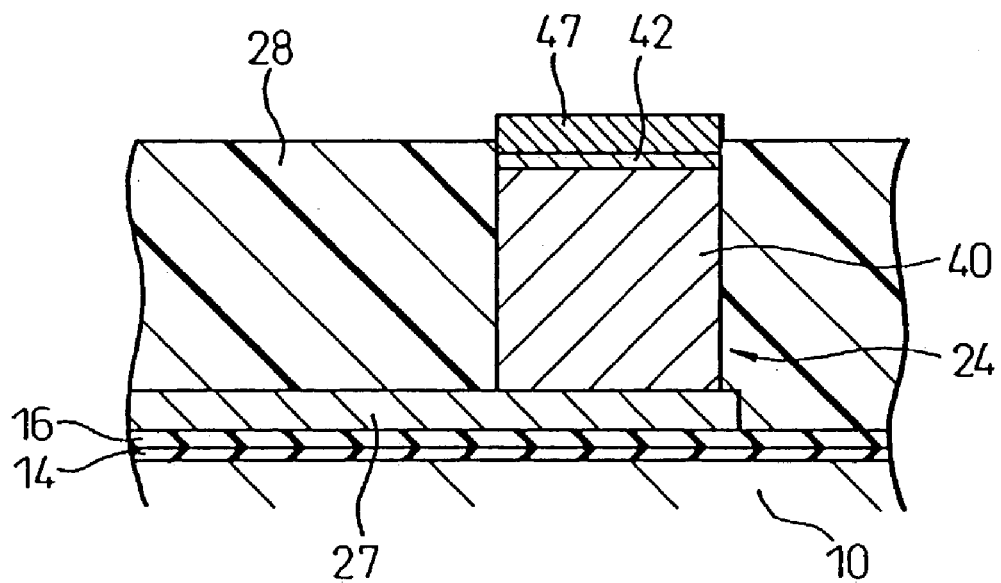
FIG. 8 shows a further example of the columnar electrode in the invention.

FIG. 8 illustrates a further columnar electrode 24 of the semiconductor wafer 10 according to the invention. In this embodiment, the columnar electrode 24 has a plated nickel film 42 and a plated solder film 47. Thus, the plated film portion consists of the two plated films 42 and 47 of nickel and solder and, consequently, this embodiment makes a production process of the semiconductor wafer 10 simpler, and reduces production cost.

Both plated nickel and solder films 42 and 47 in this embodiment have a thickness of 3 micrometers, by way of example. The height of the interface between the plated solder film 47 and the plated nickel film 42 is lower than the height of the outer surface of the resin layer 28, as in the former embodiments.

As can be understood from the foregoing, in the embodiment of the invention in which the columnar electrode has a top film of solder, it is essential that the plated film portion provided at the top of the columnar electrode comprises at least the nickel and solder films 42 and 47, with the solder film 47 being located at the top of the plated film portion. A film or films of materials useful for improving wettability of the columnar electrode by a solder, such as the palladium or the gold referred to above, may be interposed between the nickel and solder films 42 and 47.

FIGS. 9A to 9D illustrate an embodiment of the method of producing a semiconductor wafer provided with columnar electrodes having a plated film portion comprising nickel and solder films at the top thereof as described above. This method is similar to conventional methods of producing a semiconductor wafer provided with columnar electrodes except for the formation of the plated film portion 41 of the columnar electrode 24. Accordingly, FIGS. 9A to 9D mainly illustrates steps of the formation of the plated film portion 41.

Figure 9A:
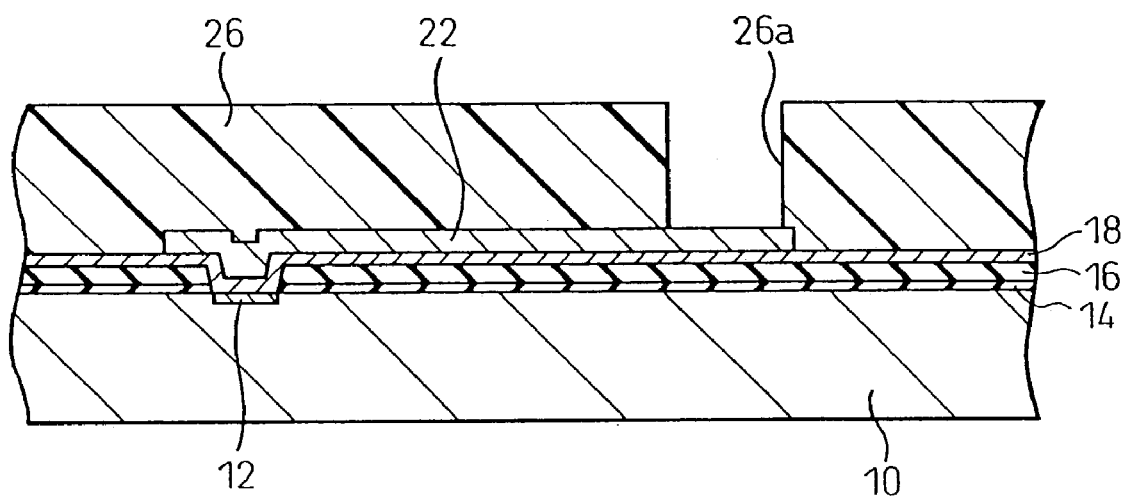
FIGS. 9A to 9D show a method of producing the semiconductor wafer illustrated in FIGS. 4 and 5.

FIG. 9A shows a condition in which a patterned copper layer 22 is formed on an insulation layer 16 of the electrode terminal-formed face of a semiconductor wafer 10, the copper layer 22 being electrically connected, at one end, with an electrode terminal 12 of the wafer 10 through a conductor layer 18, and a resist pattern 26 is then formed, the resist pattern 26 having an opening or hole 26a at the location at which a columnar electrode is to be formed at the other end of the copper layer 22.

Figure 9B:
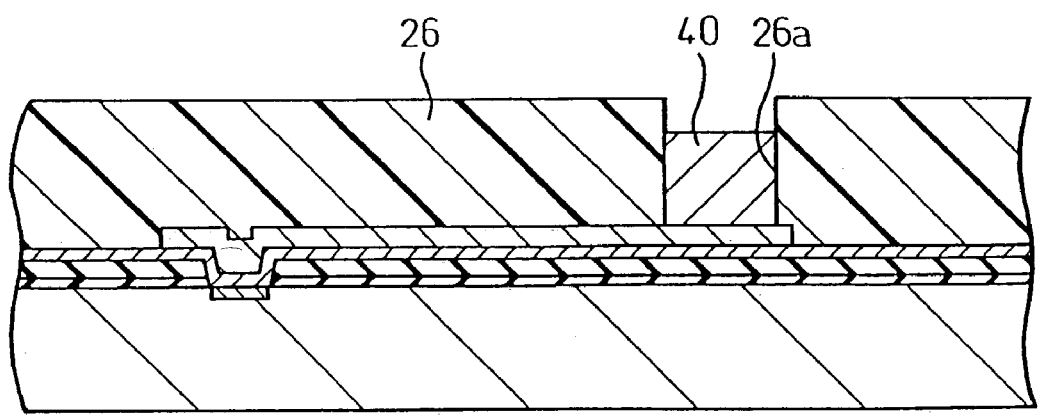

After the formation of the resist pattern 26 having the openings 26a, the exposed other end of the copper layer 22 is electrolytically plated with copper to form a plated copper portion 40 using the conductor layer 18 as an electric power supply layer, as shown in FIG. 9B. The plated copper portion 40 represents a chief conducting portion of a columnar electrode, and is formed by depositing or building up the plated copper on the exposed portion of the copper layer 22 up to a height at which the plated copper approximately fills the opening 26a. In general, a columnar electrode has a height of about 100 micrometers, and the resist pattern 26 is accordingly formed to have a thickness of about 100 micrometers.

Figure 9C:
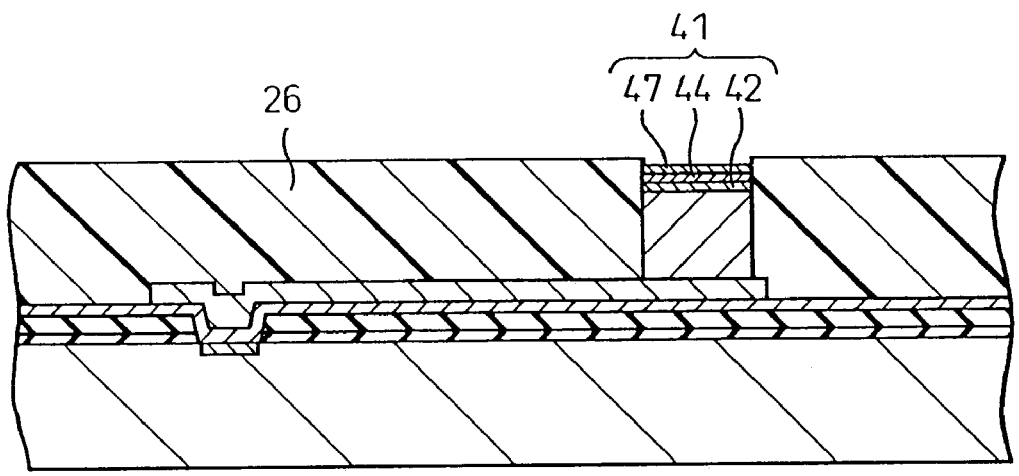

A plated film portion is then formed by plating. In the example illustrated herein, a plated nickel film (or plated Ni—Co alloy film) 42, a plated palladium film 44, and a plated solder film 47 are successively formed at the top of the plated copper portion 40 to provide the plated film portion 41, as shown in FIG. 9C. The plated nickel, palladium, and solder films 42, 44, and 47 in this example have thicknesses of 3, 0.15, and 3 micrometers, respectively.

Although the plated copper portion 40, and the plated nickel, palladium, and solder films 42, 44, and 47 may have a thickness discretionally selected, it is essential that the thicknesses of these films are determined so that the height of the interface between the plated solder film 47 and the plated palladium film 44 is lower than the height of the outer surface of an encapsulating resin layer after the encapsulation of the semiconductor wafer 10 by the resin.

Figure 9D:
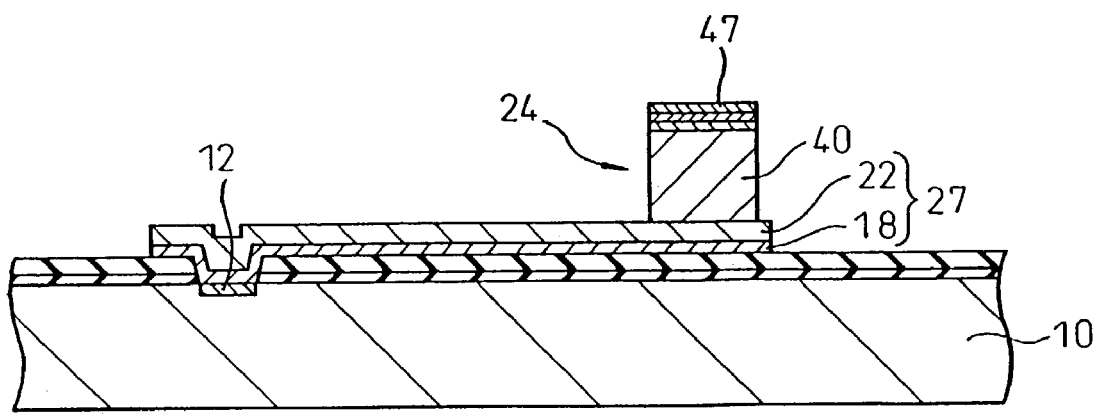

After the formation of the plated film portion 41, the resist pattern 26 is removed, and the exposed conductor layer 18 is then etched to form patterned wiring lines 27 with the overlaying copper layer 22, and to provide a semiconductor wafer 10 provided with columnar electrodes 24 having the plated film portion 41 of three-layer structure consisting of the successive plated nickel, palladium, and solder films 42, 44, and 47, as shown in FIG. 9D. The conductor layer 18 has a thickness of the order of 0.05 micrometer, which is very thinner than thicknesses of the columnar electrode 24 and the patterned wiring line 27, and, consequently, only conductor layer 18 can be removed by etching without covering the columnar electrodes 24 and the wiring lines 27 by a material such as a resist for protection.

The semiconductor wafer 10 thus obtained is then encapsulated on its columnar electrode-formed face by a resin in such a manner that the top faces of the plated solder films 47 of the columnar electrodes 24 are exposed, to produce a semiconductor wafer provided with columnar electrodes as shown in FIG. 4.

A conventional method for producing a semiconductor wafer provided with columnar electrodes can be applied to the method as described above with minor modification.

For the formation of plated nickel film 42 in the invention, metal nickel or an alloy of nickel, such as an Ni—Co alloy optionally containing P, S or the like, can be used.

For the formation of plated solder film 47, either a lead-containing solder, such as an Sn—Pb solder, or a lead-free solder, such as an Sn—Ag solder, may be used.

An external connection terminal for mounting, such as a solder ball, is then bonded to each of the columnar electrodes 24 of the encapsulated semiconductor wafer 10, and the semiconductor wafer 10 is cut-into individual chips, to provide a chip-sized semiconductor device having columnar electrodes of the invention. Bonding of external connection terminals as well as cutting of semiconductor wafer are well known to persons with ordinary skill in the art, and are not necessary to be further described herein.

In the invention, although the electrode to which an external connection terminal is to be bonded is called columnar electrode, the electrode may have any cross section. In general, an electrode bonded to an external connection terminal, such as a solder ball, has a circular cross section, as seen in FIG. 10B, which shows an enlarged perspective view of a columnar electrode 24 formed to stand up from a pad 27a at an end of a patterned wiring line 27. The side of a semiconductor wafer on which columnar electrodes 24 are located is encapsulated by a resin, and the resin fills the space between adjacent columnar electrodes 24, as shown in FIGS. 1 and 2. However, since, as a rule, adhesion of a resin to a metal cannot be said to be satisfactory, the interface between the side wall of the columnar electrode 24 and the resin layer 28 can be penetrated by a material used to bond an external connection terminal to the columnar electrode 24, such as a solder material, or can absorb moisture. As a result, there have been a problem that reliability of bonding of an eternal connection terminal to a columnar electrode is lowered.

Figure 10A:
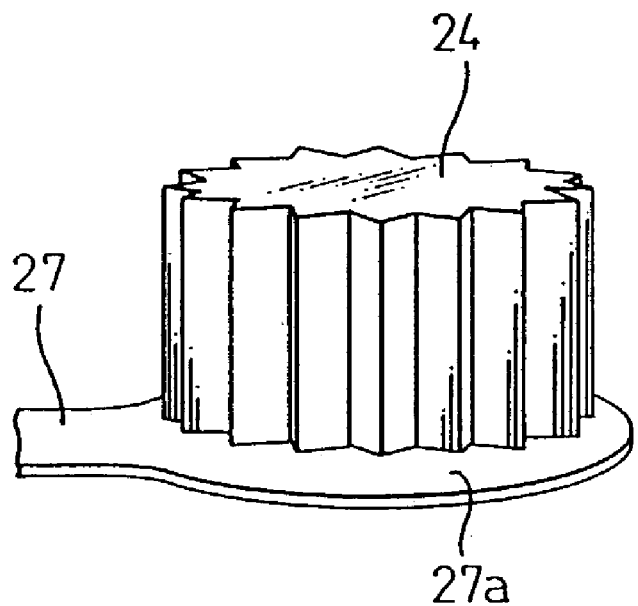
FIGS. 10A and 10B are perspective views of a columnar electrode used in the semiconductor wafer of the invention.
Figure 10B:
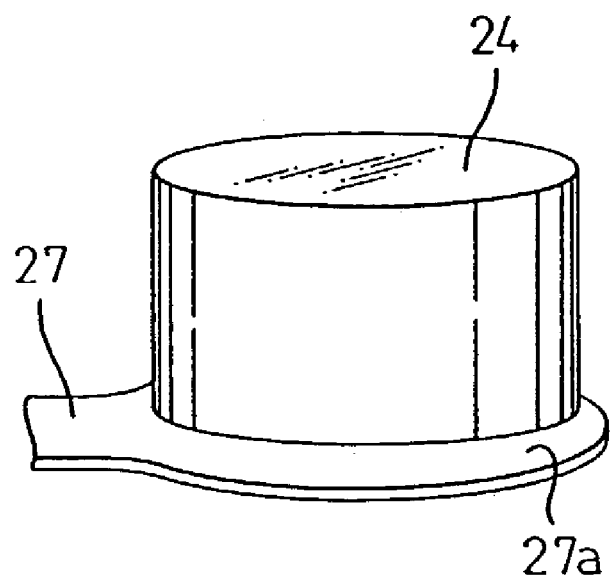
Figure 11A:
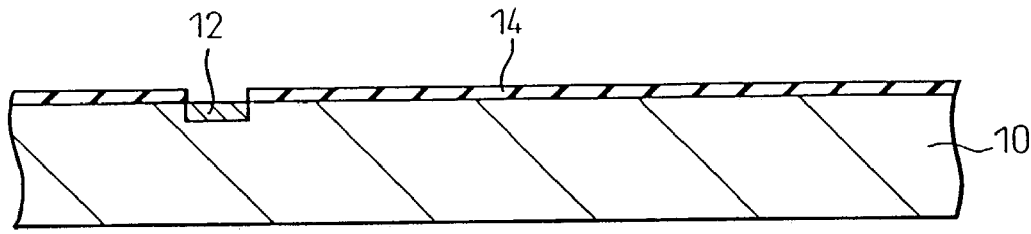
FIGS. 11A to 11G schematically illustrate a method of producing a semiconductor wafer provided with columnar electrodes.
Figure 11B:
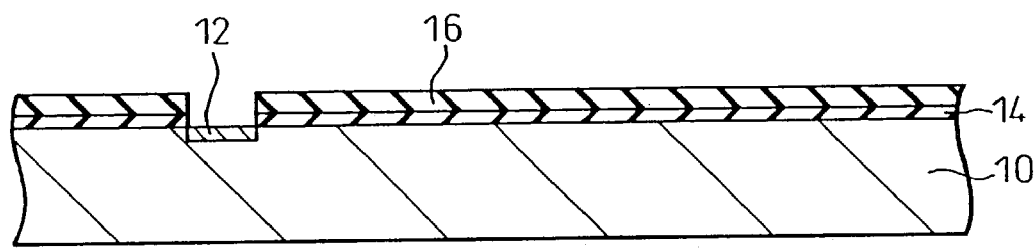
Figure 11C:
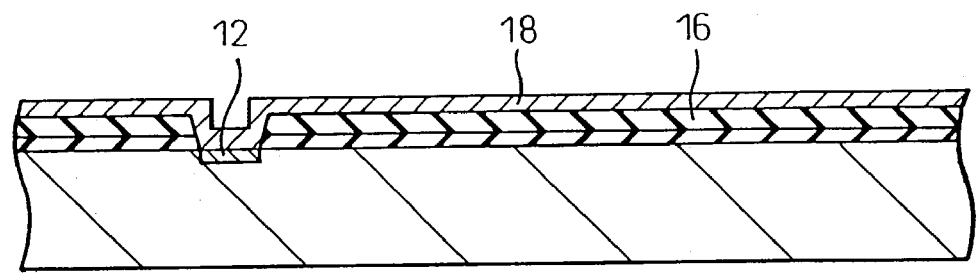
Figure 11D:
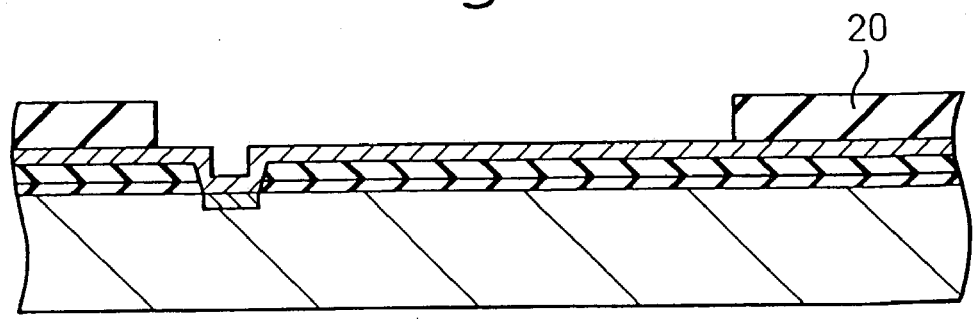
Figure 11E:
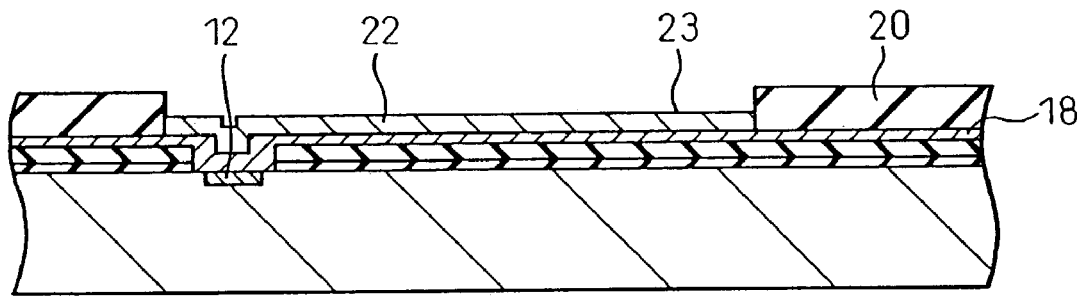
Figure 11F:
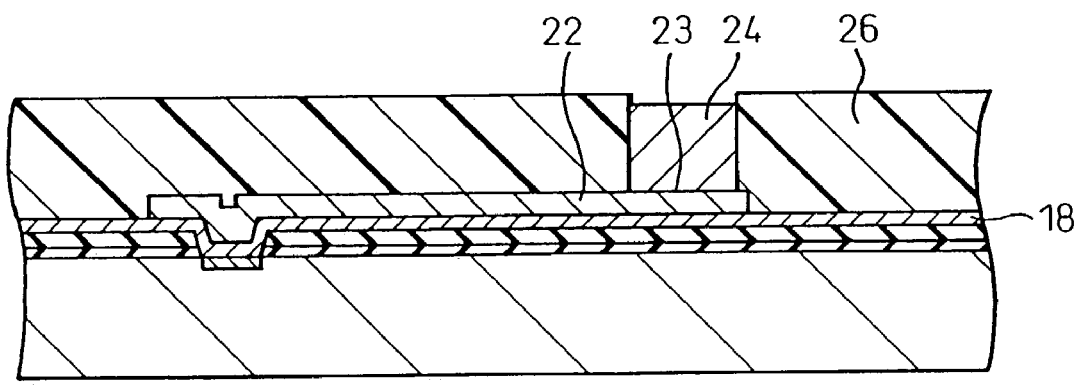
Figure 11G:
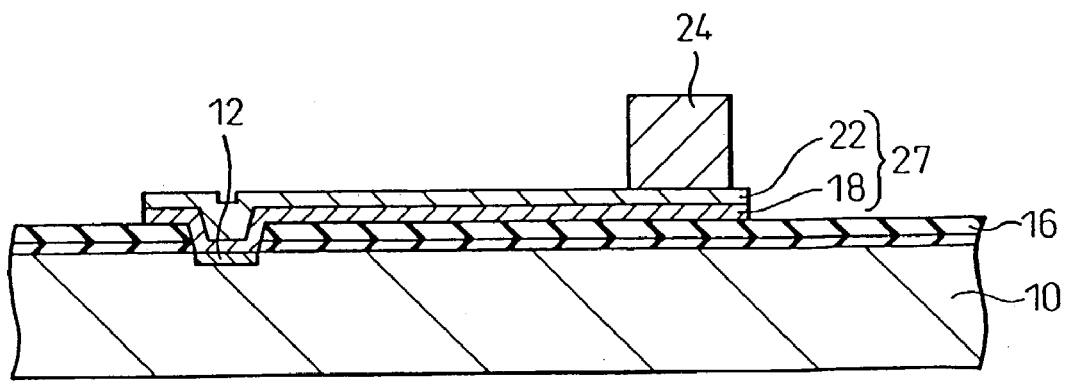

FIG. 10A shows a configuration of a columnar electrode 24 free from such problems, which represents an example of a columnar electrode having a non-circular cross section, or a side wall of uneven face. Thus, by use of the columnar electrode 24 having the uneven side wall, a contacting area of the side wall of the columnar electrode 24 with the resin layer 28 is increased, and anchoring effect of the side wall of the columnar electrode 24 with the resin layer 28 is improved, to thereby enhance adhesion of the side wall of the columnar electrode 24 to the resin layer 28.

The columnar electrode 24 has a side configuration defined by the shape of the opening 26a of the resist pattern 26, as shown in FIG. 3, and, accordingly, by forming the resist pattern 26 having openings 26a of appropriate shape, columnar electrodes 24 having an uneven side wall configuration can be easily obtained. It is also easy to form a resist pattern having openings of any shape.

To further enhance adhesion of the columnar electrode 24 to the resin layer 28, it is also useful to roughen the side of the columnar electrode 24 by a technique, such as plasma ashing, after the formation of the columnar electrode 24 and the removal of the resist layer 26.

As described, the invention provides a semiconductor wafer provided with columnar electrodes having improved solder-wettability, which enable an external terminal, such as a solder ball, to be firmly bonded thereto, and also provides a chip-sized semiconductor device having higher reliability.

The invention claimed is:

1. A method of producing a semiconductor wafer provided with columnar electrodes having electrode terminals formed on its surface, an insulation film formed so as to expose the top of the electrode terminal, patterned wiring lines formed on the insulation film, each of the patterned wiring lines being connected, at one end, with the electrode terminal, and provided with a columnar electrode formed on the other end, and an encapsulating layer formed so as to cover the electrode-formed face of the wafer while exposing the top faces of the columnar electrodes, the columnar electrodes being provided with plated nickel, palladium, and gold films successively formed at their top, the method comprising:

forming an insulation layer on the surface of a semiconductor wafer on which electrode terminals have been formed, so as to expose the top of the electrode terminals, forming a conductor layer on the electrode terminals and the insulation layer, forming a resist pattern on the conductor layer, plating the conductor layer with copper using the resist pattern as a mask and using the conductor layer as an electric power supply layer to thereby form a patterned copper layer having an end connected with the electrode terminal through the underlying conductor layer, removing the resist pattern, forming a further resist pattern on the patterned copper layer and the conductor layer, the further resist pattern having openings for formation of columnar electrodes on the other ends of the patterned copper layer, forming columnar electrodes of copper on the other ends of the copper layer in the openings by plating using the conductor layer as an electric power supply layer, forming a plated nickel film or plated nickel alloy film on the top face of the columnar electrodes, forming a plated palladium film and a plated gold film successively on the nickel or nickel alloy film, removing the further resist pattern, removing the exposed conductor layer, and encapsulating the electrode terminal-formed face of the wafer so as to expose the gold film at the top of the columnar electrode.

2. A method of producing a semiconductor wafer provided with columnar electrodes having electrode terminals formed on its surface, an insulation film formed so as to expose the top of the electrode terminals, patterned wiring lines formed on the insulation film, each of the patterned wiring lines being connected, at one end, with the electrode terminal, and provided with a columnar electrode formed on the other end, and an encapsulating layer formed so as to cover the electrode-formed face of the wafer while exposing the top face of the colunmar electrodes, the columnar electrodes being provided at their top with a plated solder film, the process comprising:

forming an insulation layer on the surface of a semiconductor wafer on which electrode terminals have been formed, so as to expose the tops of the electrode terminals, forming a conductor layer on the electrode terminals and the insulation layer, forming a resist pattern on the conductor layer, plating the conductor layer with copper using the resist pattern as a mask and using the conductor layer as an electric power supply layer to thereby form a patterned copper layer having an end connected with the electrode terminal through the underlying conductor layer, removing the resist pattern, forming a further resist pattern on the patterned copper layer and the conductor layer, the further resist pattern having openings for formation of columnar electrodes on the other ends of the patterned copper layer, forming a portion of copper of a columnar electrode on the other end of the copper layer in the openings by plating using the conductor layer as an electric power supply layer, forming a plated film on the top face of the copper portion of the columnar electrodes, forming a plated solder film on the top of the plated film, removing the further resist pattern, removing the exposed conductor layer, and encapsulating the electrode terminal-formed face of the wafer so as to expose the top of the plated solder film.

3. A method of producing a semiconductor device having electrode terminals formed in a surface of a semiconductor substrate, an insulation film formed so as to expose the top of the electrode terminals, patterned wiring lines formed on the insulation film, each of the patterned wiring lines being connected, at one end, with the electrode terminal, and provided with a columnar electrode formed on the other end, external connection terminals bonded to the top of the columnar electrodes, and an encapsulating layer formed so as to cover the electrode-formed face of the semiconductor device while exposing the external connection terminals, the interface between the top of the columnar electrode and the external connection terminal being located below the outer surface of the encapsulating layer, the method comprising:

forming an insulation layer on the surface of a semiconductor wafer on which electrode terminals have been formed, so as to expose the tops of the electrode terminals, forming a conducting layer on the electrode terminals and the insulation layer, forming a resist pattern on the conductor layer, plating the conductor layer with copper using the resist pattern as a mask and using the conductor layer as an electric power supply layer to thereby form a patterned copper layer having an end connected with the electrode terminal through the underlying conductor layer, removing the resist pattern, forming a further resist pattern on the patterned copper layer and the conductor layer, the further resist pattern having openings for formation of columnar electrodes on the other ends of the patterned copper layer, forming a portion of copper of a columnar electrode on the other end of the copper layer in the openings by plating using the conductor layer as an electric power supply layer, forming a plated film on the top faces of the copper portion of the columnar electrodes, forming a plated solder film on the top of the plated film, removing the further resist pattern, removing the exposed conductor layer, encapsulating the electrode terminal-formed face of the wafer so as to expose the top of the plated solder film, to thereby provide a semiconductor wafer provided with columnar electrodes, bonding an external connection terminal to the top of the plated solder film of each of the columnar electrodes, and cutting the wafer into individual chips.

4. The method of claim 3, wherein the external connection terminal is formed by bonding a solder ball to the top of the plated solder film, and heating the solder ball to form a solder bump.

5. A method for manufacturing a chip-sized semiconductor wafer package comprising:

A) providing a semiconductor chip comprising a plurality of chip electrode terminals disposed on a first side;

B) forming a first insulation layer covering the first side and patterned to expose the chip electrode terminals;

C) forming a first conductive metal layer over the first insulation layer;

D) forming a first patterned resist over the first conductive layer wherein the first pattern exposes the first conducting layer and depicts a wiring pattern;

E) forming patterned wiring lines by electroplating a second conductive metal onto the exposed portions of the first conductive layer, wherein a plurality of the wiring lines are each disposed in electrical contact with a chip electrode terminal and have a portion not directly disposed above the chip electrode terminal;

F) removing the first patterned resist and underlying first conductive layer;

G) forming a second patterned resist on the first side wherein the second pattern depicts openings for columnar electrodes, wherein the openings each contact a wiring line in a portion not directly disposed above the chip electrode terminal;

H) forming columnar electrodes by electroplating a conductive metal which is not palladium or nickel, I) forming on the tops of the columnar electrodes a metal layer comprising at least one of nickel or palladium;

J) removing the second resist;

K) encapsulating the semiconductor chip having wiring lines and columnar electrodes in a resin wherein the faces of the columnar electrodes are not covered by the resin by:

a) placing the semiconductor chip with the first side facing upward;

b) adding fluid resin in an amount sufficient to encapsulate a portion but not all of the height of the columnar electrodes;

c) pressing onto the tops of the columnar electrodes a soft film, wherein the tops of the columnar electrodes penetrate into the soft film and the surface of the soft film not penetrated by the electrodes contacts the fluid resin;

d) curing the resin, wherein the top of the cured resin is at the height of the bottom surface of the soft film; and e) removing the soft film; and L) forming solder bumps on the tops of the columnar electrodes to form outer electrode terminals, thereby forming a semiconductor wafer package comprising a semiconductor chip comprising a passivization layer and a plurality of chip electrode terminals disposed on a first side which each contact one of a plurality of patterned wiring lines, wherein a plurality of the wiring lines have a portion not directly disposed above the contacted chip electrode terminal; and having columnar electrodes disposed on a plurality of wiring lines with the bottom of the columnar electrode being in electrical contact with and above the respective wiring line portion not directly disposed above the electrode terminal, and where the top of the columnar electrodes have an intervening palladium-containing or nickel-containing film disposed thereon in an amount sufficient to inhibit solder diffusion into the columnar electrode; and outer electrode terminals comprising a solder layer; and an encapsulating layer formed so as to cover the electrode-containing face of the chip while exposing the top face of the columnar electrodes and the outer electrode terminals wherein the outer electrode terminals project over the outer surface of the encapsulating layer, and the interface between the solder outer electrode terminals and the top of an intervening metal layer overlying the columnar electrode on which the outer electrode terminal is formed is located below the outer surface of the encapsulating layer.

6. The method of claim 5 wherein the semiconductor chip comprises a plurality of chip electrode terminals and a passivation layer disposed on a first side.

7. The method of claim 5 wherein the columnar electrodes conductive metal is copper.

8. The method of claim 7 wherein the metal layer on the tops of the columnar electrodes comprises nickel, the process further comprising:
   I') forming on the nickel metal layer tops of the columnar electrodes a columnar electrode top second metal layer comprising palladium.

9. The method of claim 8 further comprising:
   I") forming on the palladium columnar electrode tops second metal layer a third metal layer comprising gold.

10. The method of claim 7 wherein the columnar electrode penetrate a distance into the soft film a distance less than the thickness of the metal layer(s) disposed on the top of the copper columnar electrodes, so that no copper portion of the columnar electrode penetrates the soft film, and the soft film prevents resin from forming on the top surface and on the portions of the sides of the columnar electrodes penetrating the soft film, thereby allowing better adhesion between the solder bumps and the columnar electrodes.

11. The method of claim 8 wherein the columnar electrode penetrate a distance into the soft film a distance less than the thickness of the metal layer(s) disposed on the top of the copper columnar electrodes, so that no copper portion of the columnar electrode penetrates the soft film, and the soft film prevents resin from forming on the top surface and on the portions of the sides of the columnar electrodes penetrating the soft film, thereby allowing better adhesion between the solder bumps and the columnar electrodes.

12. The method of claim 9 wherein the columnar electrode penetrate a distance into the soft film a distance less than the thickness of the metal layer(s) disposed on the top of the copper columnar electrodes, so that no copper portion of the columnar electrode penetrates the soft film, and the soft film prevents resin from forming on the top surface and on the portions of the sides of the columnar electrodes penetrating the soft film, thereby allowing better adhesion between the solder bumps and the columnar electrodes.

13. The method of claim 8 further comprising:
   I'") forming on the palladium columnar electrode tops second metal layer a layer comprising solder.

14. The method of claim 9 further comprising:
   I'") forming on the gold columnar electrode tops third metal layer a layer comprising solder.

15. The method of claim 13 wherein the columnar electrode penetrate a distance into the soft film a distance less than the thickness of the metal layer(s) disposed on the top of the copper columnar electrodes, so that no copper portion of the columnar electrode penetrates the soft film, and the soft film prevents resin from forming on the top surface and on the portions of the sides of the columnar electrodes penetrating the soft film, thereby allowing better adhesion between the solder bumps and the columnar electrodes.

16. The method of claim 14 wherein the columnar electrode penetrate a distance into the soft film a distance less than the thickness of the metal layer(s) disposed on the top of the copper columnar electrodes, so that no copper portion of the columnar electrode penetrates the soft film, and the soft film prevents resin from forming on the top surface and on the portions of the sides of the columnar electrodes penetrating the soft film, thereby allowing better adhesion between the solder bumps and the columnar electrodes.

* * * * *